(12) United States Patent
Fried et al.

(10) Patent No.: US 8,232,624 B2
(45) Date of Patent: Jul. 31, 2012

(54) SEMICONDUCTOR STRUCTURE HAVING VARACTOR WITH PARALLEL DC PATH ADJACENT THERETO

(75) Inventors: David M. Fried, Hopewell Junction, NY (US); Joseph E. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 352 days.

(21) Appl. No.: 12/558,839

(22) Filed: Sep. 14, 2009

(65) Prior Publication Data

US 2011/0062555 A1    Mar. 17, 2011

(51) Int. Cl.
*H01L 29/93* (2006.01)

(52) U.S. Cl. . 257/600; 257/595; 257/622; 257/E29.344; 438/379

(58) Field of Classification Search .......... 257/595, 257/600, 622, E29.344; 438/379
See application file for complete search history.

(56) References Cited

U.S. PATENT DOCUMENTS

| | | | | |
|---|---|---|---|---|
| 4,967,257 | A * | 10/1990 | Inoue | 257/369 |
| 5,041,887 | A * | 8/1991 | Kumagai et al. | 257/303 |
| 6,204,527 | B1 * | 3/2001 | Sudo et al. | 257/301 |
| 6,228,734 | B1 | 5/2001 | Bliss et al. | |
| 6,452,224 | B1 * | 9/2002 | Mandelman et al. | 257/296 |
| 6,521,506 | B1 | 2/2003 | Coolbaugh et al. | |
| 6,627,954 | B1 | 9/2003 | Seefeldt | |
| 6,657,242 | B1 | 12/2003 | Norstrom et al. | |
| 6,855,995 | B2 | 2/2005 | Altmann | |
| 6,870,212 | B2 * | 3/2005 | Chang et al. | 257/314 |
| 6,882,029 | B1 | 4/2005 | Gau et al. | |
| 6,943,399 | B1 | 9/2005 | Gau | |
| 7,223,667 | B2 | 5/2007 | Tseng | |
| 7,242,071 | B1 | 7/2007 | Liu et al. | |
| 7,323,948 | B2 | 1/2008 | Ding et al. | |
| 7,335,956 | B2 | 2/2008 | Chen et al. | |
| 7,378,327 | B2 | 5/2008 | Kao | |
| 8,008,748 | B2 * | 8/2011 | Collins et al. | 257/600 |
| 2004/0032004 | A1 | 2/2004 | Coolbaugh et al. | |
| 2005/0026444 | A1 | 2/2005 | Babu et al. | |
| 2005/0212048 | A1 | 9/2005 | Litwin | |
| 2006/0043476 | A1 | 3/2006 | Kao | |
| 2006/0114074 | A1 | 6/2006 | Matsui et al. | |
| 2006/0220181 | A1 | 10/2006 | Cheng et al. | |
| 2007/0126083 | A1 | 6/2007 | Suzuki et al. | |
| 2007/0205430 | A1 | 9/2007 | Collins et al. | |

(Continued)

OTHER PUBLICATIONS

U.S. Appl. No. 12/342,609, Patent Application, Dec. 23, 2008, Currently pending, International Business Machines Incorporated, 56 pages.

*Primary Examiner* — Allan R Wilson

(74) *Attorney, Agent, or Firm* — Hoffman Warnick LLC; Anthony J. Canale

(57) ABSTRACT

A semiconductor structure includes a semiconductor substrate having a first region of a first polarity and a second region of a second polarity adjacent to the first region; and a first terminal including: a first deep trench located in the first region, a first node dielectric abutting all but an upper portion of sidewalls and a bottom of the first deep trench; a first conductive inner electrode inside the first node dielectric and electrically insulated from the first region by the first node dielectric; and a first electrical contact electrically coupling the first conductive inner electrode to the first region.

10 Claims, 7 Drawing Sheets

U.S. PATENT DOCUMENTS

| | | |
|---|---|---|
| 2007/0278614 A1 | 12/2007 | Collins et al. |
| 2008/0042172 A1* | 2/2008 | Hirler et al. .................. 257/288 |
| 2008/0087978 A1 | 4/2008 | Coolbaugh et al. |
| 2008/0164507 A1* | 7/2008 | Chang et al. .................. 257/312 |
| 2008/0169495 A1 | 7/2008 | Orner et al. |
| 2008/0283890 A1* | 11/2008 | Dyer ............................. 257/301 |
| 2010/0155897 A1 | 6/2010 | Collins et al. |

* cited by examiner

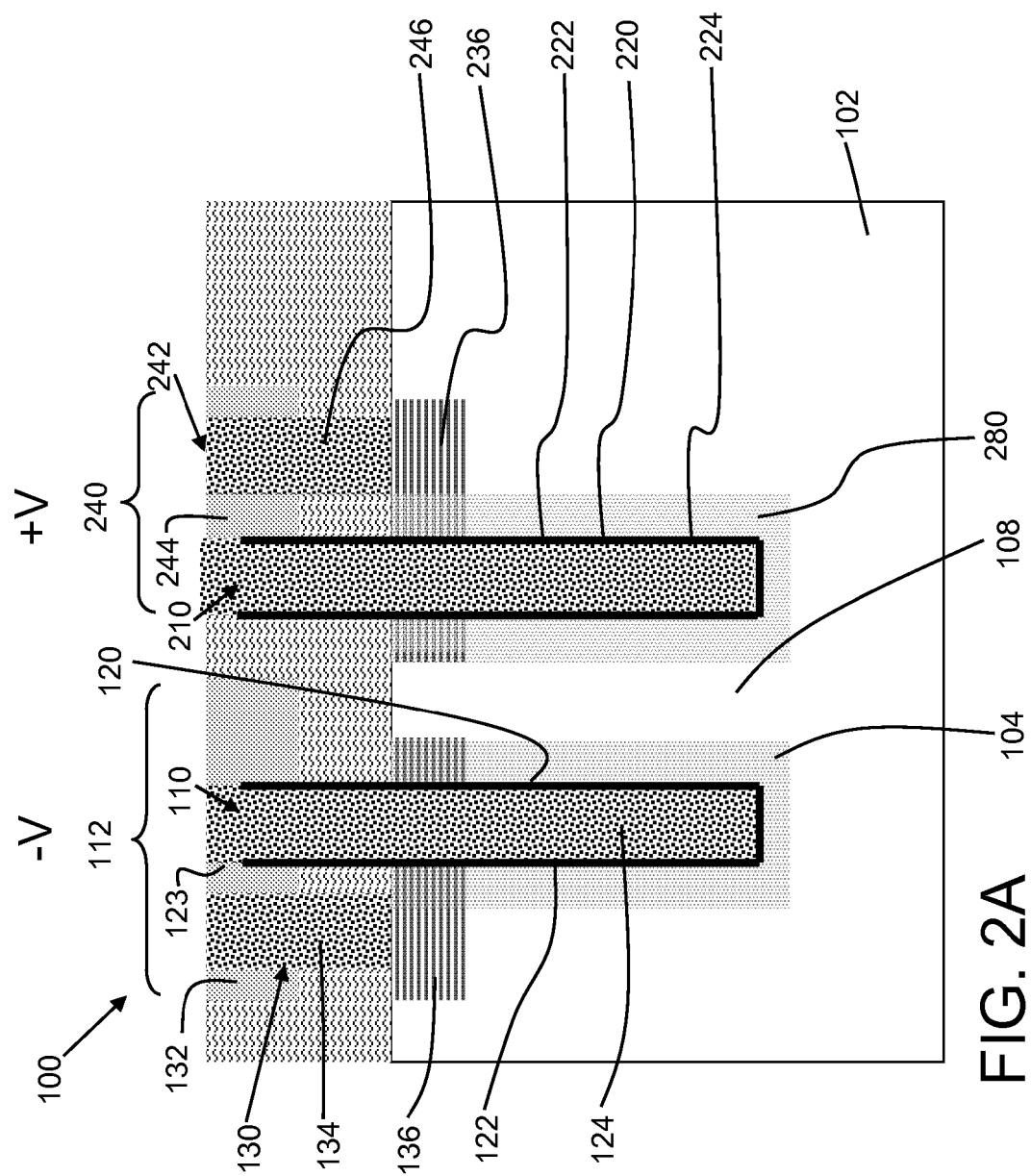

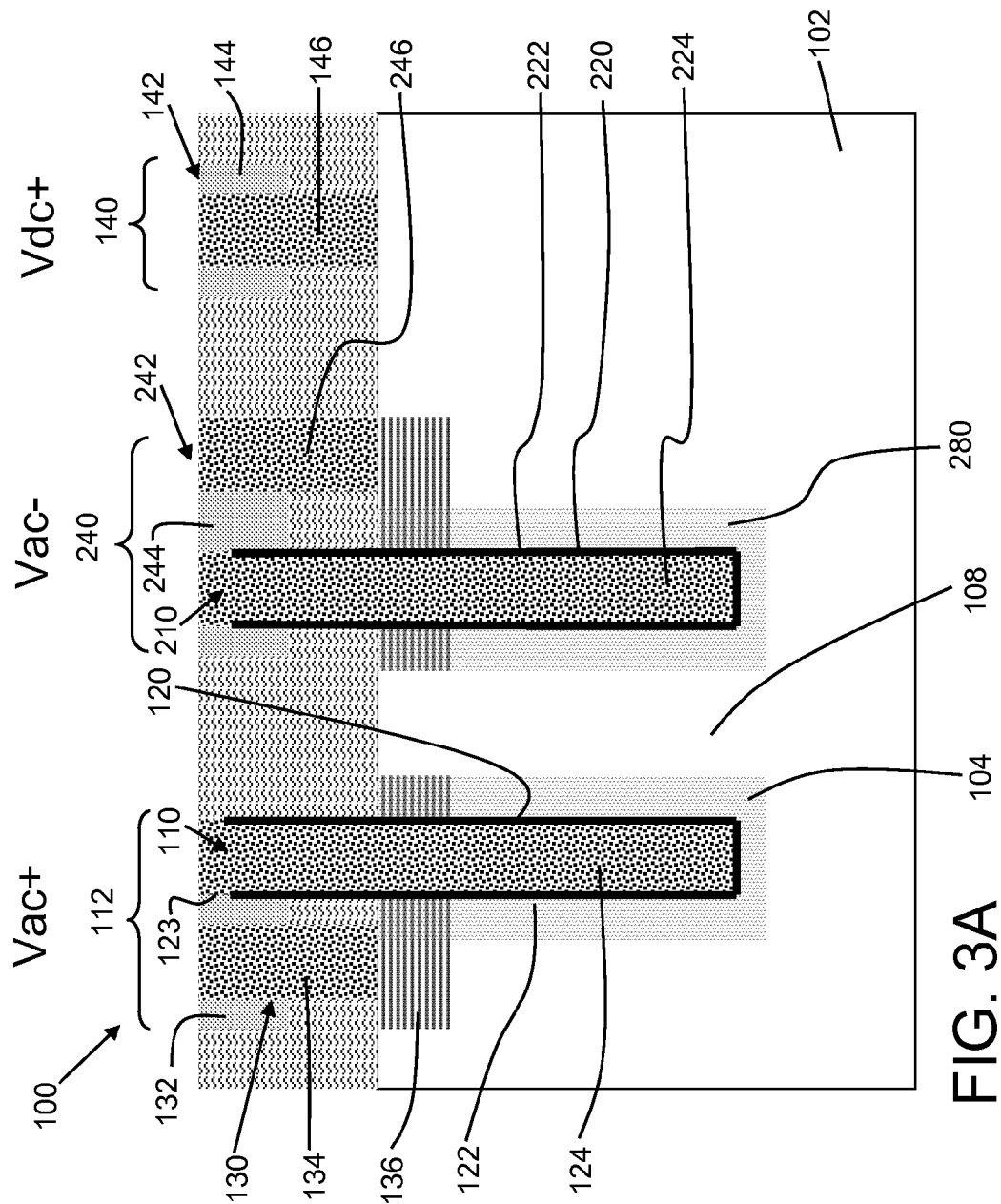

SEMICONDUCTOR STRUCTURE HAVING VARACTOR WITH PARALLEL DC PATH ADJACENT THERETO

BACKGROUND

1. Technical Field

The disclosure relates generally to a semiconductor structure, and more particularly, to a deep trench varactor having a parallel direct current (DC) path adjacent thereto.

2. Background Art

A varactor is a solid-state diode the capacitance of which changes depending on a voltage applied thereto. Varactors are used in, among other things, embedded dynamic random access memory (eDRAM) and fin field effect transistor (Fin-FET) structures in conventional semiconductor-on-insulator (SOI) technologies. In order for their continued use at the 22 nm node of complementary metal-oxide semiconductor (CMOS) technology, further process elements and added costs are expected.

BRIEF SUMMARY

A first aspect of the disclosure provides a semiconductor structure comprising: a semiconductor substrate having a first region of a first polarity and a second region of a second polarity adjacent to the first region; and a first terminal including: a first deep trench located in the first region, a first node dielectric abutting all but an upper portion of sidewalls and a bottom of the first deep trench; a first conductive inner electrode inside the first node dielectric and electrically insulated from the first region by the first node dielectric, and a first electrical contact electrically coupling the first conductive inner electrode to the first region.

A second aspect of the disclosure provides a semiconductor structure comprising: a semiconductor substrate having a first region of a first polarity and a second region of a second polarity adjacent to the first region and a third region of the first polarity, the second region separating the first region and the third region; a first terminal including: a first deep trench located in the first region, a first node dielectric abutting all but an upper portion of sidewalls and a bottom of the first deep trench; a first conductive inner electrode inside the first node dielectric and electrically insulated from the first region by the first node dielectric, and a first electrical contact electrically coupling the first conductive inner electrode to the first region; a second terminal including: a second electrical contact electrically coupled to the second region of the semiconductor substrate; and a third terminal including: a second deep trench located in the third region, a second node dielectric abutting all but an upper portion of sidewalls and a bottom of the second deep trench; a second conductive inner electrode inside the second node dielectric and electrically insulated from the third region by the second node dielectric, and a third electrical contact electrically coupling the second conductive inner electrode to the third region; and a first connection region at a surface of the semiconductor substrate coupling the first electrical contact to the first region, and a second connection region at the surface of the semiconductor substrate electrically coupling the third electrical contact to the third region.

A third aspect of the disclosure provides a semiconductor structure comprising: a semiconductor substrate having a first region of a first polarity, a second region of a second polarity adjacent to the first region and a third region having the first polarity, the second region separating the first region and the third region; and a first terminal including: a first deep trench located in the first region, a first node dielectric abutting all but an upper portion of sidewalls and a bottom of the first deep trench; a first conductive inner electrode inside the first node dielectric and electrically insulated from the first region by the first node dielectric, and a first electrical contact electrically coupling the first conductive inner electrode to the first region; a connection region at a surface of the semiconductor substrate electrically coupling the first electrical contact to the first region; and a second terminal including: a second deep trench located in the third region, a second node dielectric abutting all but an upper portion of sidewalls and a bottom of the second deep trench; a second conductive inner electrode inside the second node dielectric and electrically insulated from the third region by the second node dielectric, and a second electrical contact electrically coupling the second conductive inner electrode to the third region, wherein the first and third regions includes a n-type dopant and the second region includes a p-type dopant.

A fourth aspect of the disclosure provides a design structure embodied in a machine readable medium for designing, manufacturing, or testing an integrated circuit, the design structure comprising: a semiconductor structure comprising: a semiconductor substrate having a first region of a first polarity and a second region of a second polarity adjacent to the first region; and a first terminal including: a first deep trench located in the first region, a first node dielectric abutting all but an upper portion of sidewalls and a bottom of the first deep trench; a first conductive inner electrode inside the first node dielectric and electrically insulated from the first region by the first node dielectric, and a first electrical contact electrically coupling the first conductive inner electrode to the first region.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIGS. 2A-B show cross-sectional views of another embodiment of a semiconductor structure.

FIGS. 3A-B show cross-sectional views of yet another embodiment of a semiconductor structure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Referring to FIGS. 1, 2A-2B, 3A-3B and 4, embodiments of a semiconductor structure 100 are illustrated. Structure 100 includes an SOI wafer comprising semiconductor substrate 102 having a first region 104 of a first polarity and a second region 108 of a second polarity adjacent to first region 104.

Figure 1:
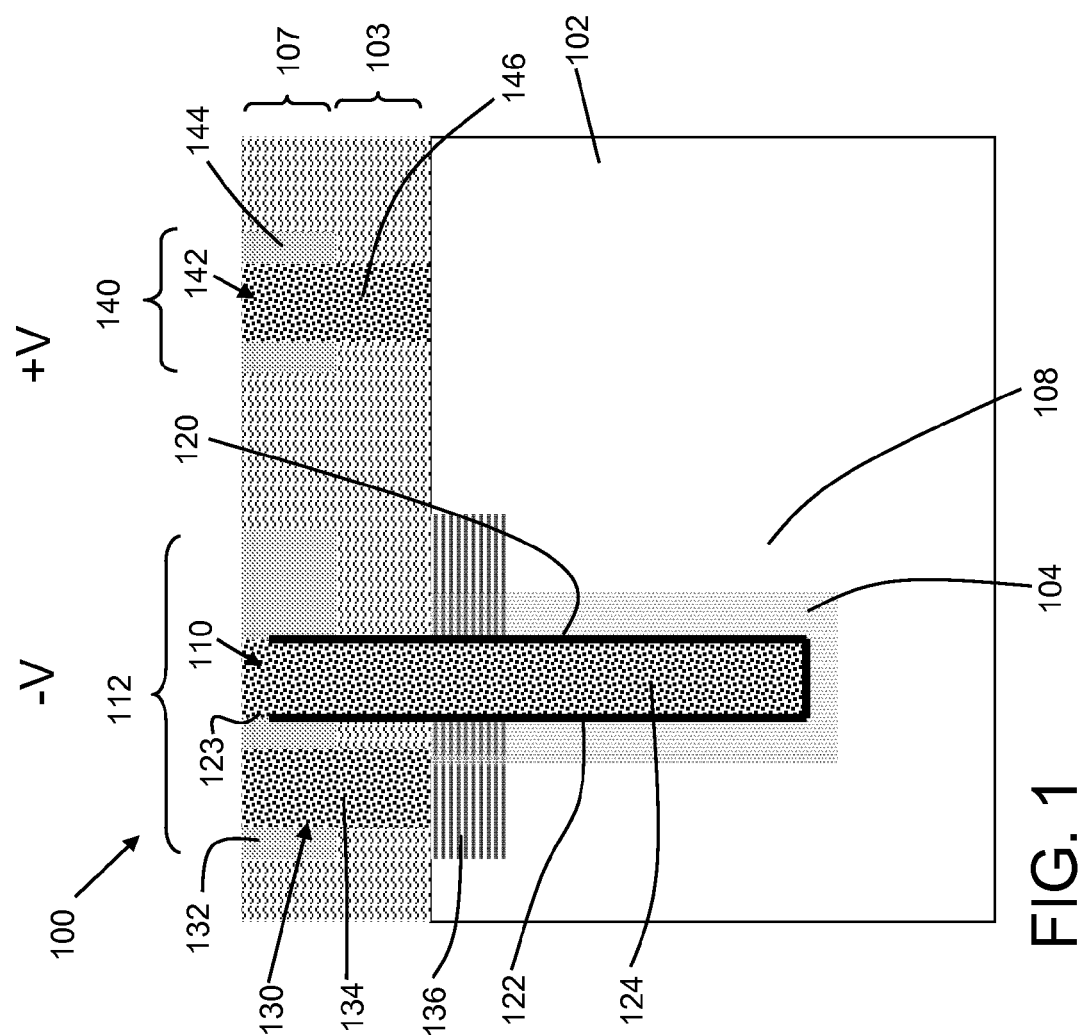
FIG. 1 shows a cross-sectional view of one embodiment of a semiconductor structure.

Substrate 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 102 may be strained. As shown in FIG. 1 only for clarity, above semiconductor substrate 102 is a buried insulator layer 103, e.g., buried oxide (BOX), and above buried insulator layer 102 is an active silicon layer 107 (gray area within surrounding interlevel dielectric (ILD)), in which transistors are typically fabricated to form electronic circuits. Active silicon layer 107 may take the form of any of the materials listed above for substrate 102.

First region 104 and second region 108 may each be formed by doping in a conventional manner, e.g., ion implanting with appropriate masking. The first and second polarities are different from one another based on a different dopant concentration (of a single conductivity type) or a doping of a different conductivity type, e.g., n-type or p-type. N-type dopants may include but are not limited to: phosphorous (P), arsenic (As), antimony (Sb), and p-type dopants may include but are not limited to: boron (B), indium (In) and gallium (Ga). In one embodiment, first region 104 includes an n-type band within a p-type second region 108. It is understood, however, that in particular applications, the types may be switched.

Structure 100 also includes a varactor 110 including a first terminal 112. First terminal 112 includes a first deep trench 120 located in first region 104 and a first node dielectric 122 abutting all but an upper portion 123 of sidewalls and a bottom of first deep trench 120. First node dielectric 122 may include any now known or later developed insulator appropriate for forming a trench capacitor, e.g., silicon oxide, silicon nitride, silicon oxynitride, high-k material having a relative permittivity above about 10, or any combination of these materials. Examples of high-k material include but are not limited to metal oxides such as $Ta_2O_5$, $BaTiO_3$, $HfO_2$, $ZrO_2$, $Al_2O_3$, or metal silicates such as HfSixOy or HfSixOyNz, where x, y, and z represent relative proportions, each greater than or equal to zero and x+y+z=1 (1 being the total relative mole quantity).

First terminal 112 also includes a first conductive inner electrode 124 that is positioned inside first node dielectric 122 and is electrically insulated from first region 104 by the first node dielectric Inner electrode 124 material may include, for example, amorphous silicon, polycrystalline silicon (hereinafter "polysilicon"), germanium, silicon germanium, a metal (e.g., tungsten, titanium, tantalum, ruthenium, cobalt, copper, aluminum), a conducting metallic compound material (e.g., tungsten silicide, tungsten nitride, titanium nitride, tantalum nitride, ruthenium oxide, cobalt silicide, nickel silicide), or any suitable combination of these materials Inner electrode 124 material may further include dopants. In one embodiment, inner electrode 124 material includes doped polysilicon. Methods for forming node dielectric 122 and inner electrode 124 material include but are not limited to thermal oxidation, chemical oxidation, thermal nitridation, atomic layer deposition (ALD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, sputtering, plating, evaporation, ion beam deposition, electron beam deposition and/or laser assisted deposition.

In contrast to conventional trench capacitors, a first electrical contact 130 electrically couples first conductive inner electrode 124 to first region 104. First electrical contact 130 may include any now known or later developed manner of coupling inner electrode 124 to first region 104. In one illustrated example, first electrical contact 130 includes an interconnect 132 comprising a doped portion of active silicon layer 107 (FIG. 1) about an upper region of varactor 110 and a via 134 to first region 104 Inner electrode 124 directly contacts interconnect 132 within active silicon layer 107 (FIG. 1) where upper portion 123 of node dielectric 122 is omitted. Interconnect 132 is optionally silicided on the top surface. Interconnect 132 and via 134 may be formed using any conventional techniques, e.g., damascene or dual damascene processing. In one embodiment, as illustrated, a connection region 136 may be positioned at a surface of semiconductor substrate 102 to electrically couple first electrical contact 130 to first region 104. Connection region 136 may include a doped portion of substrate 102, e.g., an n-type doped region. It is emphasized, however, that connection region 136 may not be necessary where first region 104 is sufficiently wide enough for via 134 to electrically couple thereto.

Figure 3B:
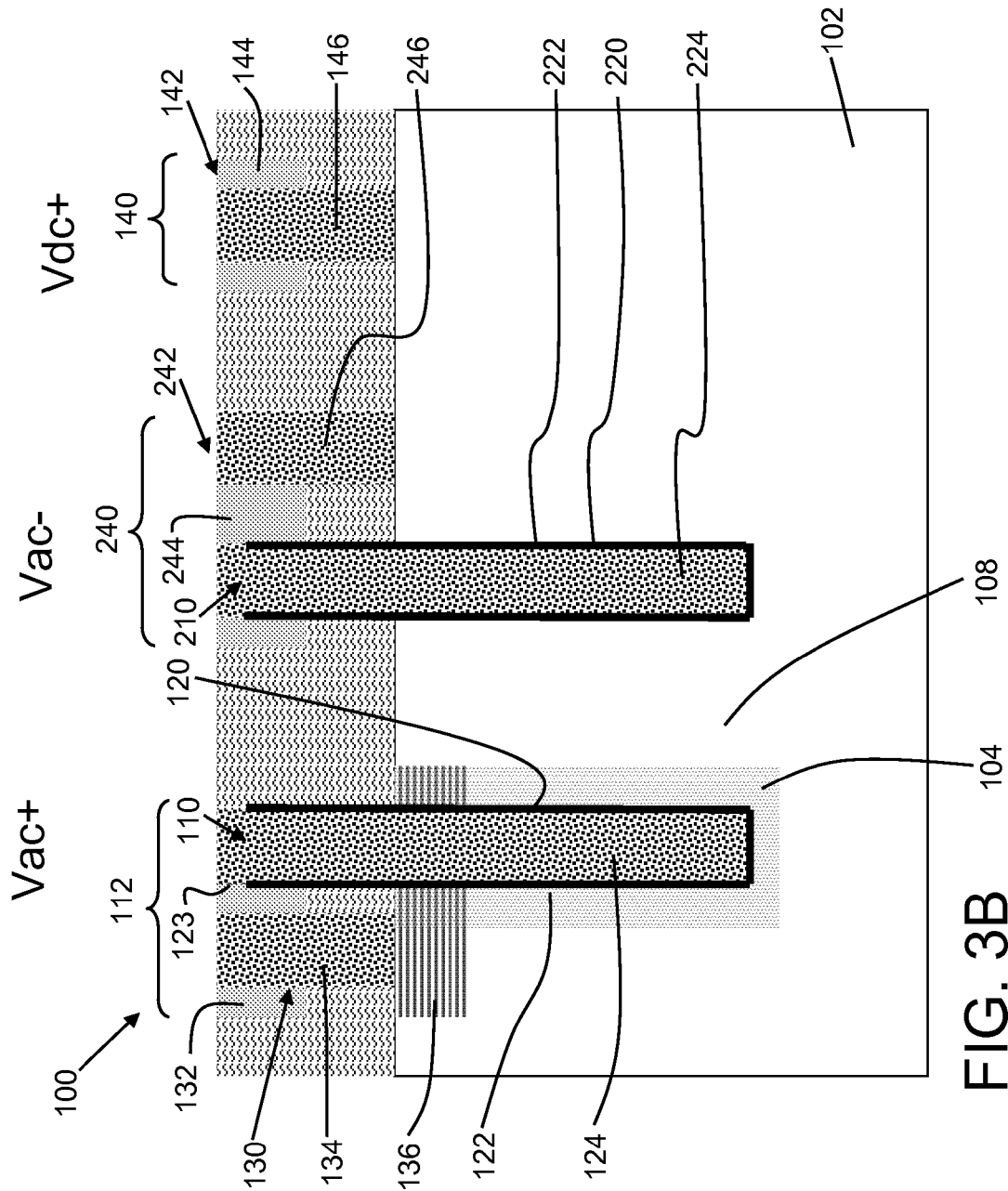

As shown in FIGS. 1, 3A and 3B, in one embodiment, structure 100 may also include a second terminal 140 including a second electrical contact 142 electrically coupled to second region 108 of semiconductor substrate 102. In the illustrated embodiment, terminal 142 may include an interconnect 144 and a via 146 to second region 108. Interconnect 144 and via 146 may be formed using any conventional techniques, e.g., damascene or dual damascene processing. As will be described in greater detail, however, not all embodiments require this type of second terminal 140.

In operation, varactor 110 is formed from inner electrode 124 and node dielectric 122 to first region 104, e.g., an n-band region, resulting in a junction varactor. First region 104 is depleted by negative voltage on inner electrode 124, which biases varactor 110 more negatively, resulting in a depletion of negative (free) charge that lowers capacitance by deflecting (conduction) electrons away from first region 104 and causing a depletion zone around first region 104. Similarly, second region 108 is p-type in this example, and will be depleted of (free) holes with increasing reverse bias. First region 104 (perhaps with connection region 136) and inner electrode 124 are, however, electrically coupled such that they form a single, first terminal 112; further, substrate 108 and second electrical contact 142 form a second terminal 140. This embodiment allows biasing of the junction more to reverse bias, resulting in more negative charge on first terminal 112, which reverse biases the junction more p-type creating depletion across the junction and lowering capacitance. Structure 100 in these embodiments, however, provides an improved Q factor (i.e., ratio of capacitive reactance to real resistance) compared to a typical varactor by providing a reduced dynamic resistance that would normally be caused by current traveling down inner electrode 124 and first region 104. In particular, by electrically coupling inner electrode 124 to first region 104, an alternating current (AC) signal is allowed to pass down inner electrode 124 (a good conductor) and then capacitively pass to node dielectric 122 to first region 104 (n-band) at the bottom and the top of trench 120, which improves the Q factor substantially, since the AC component of the current will pass through the highly conductive trench fill, rather than the more resistive n-band surrounding the trench.

Figure 2B:
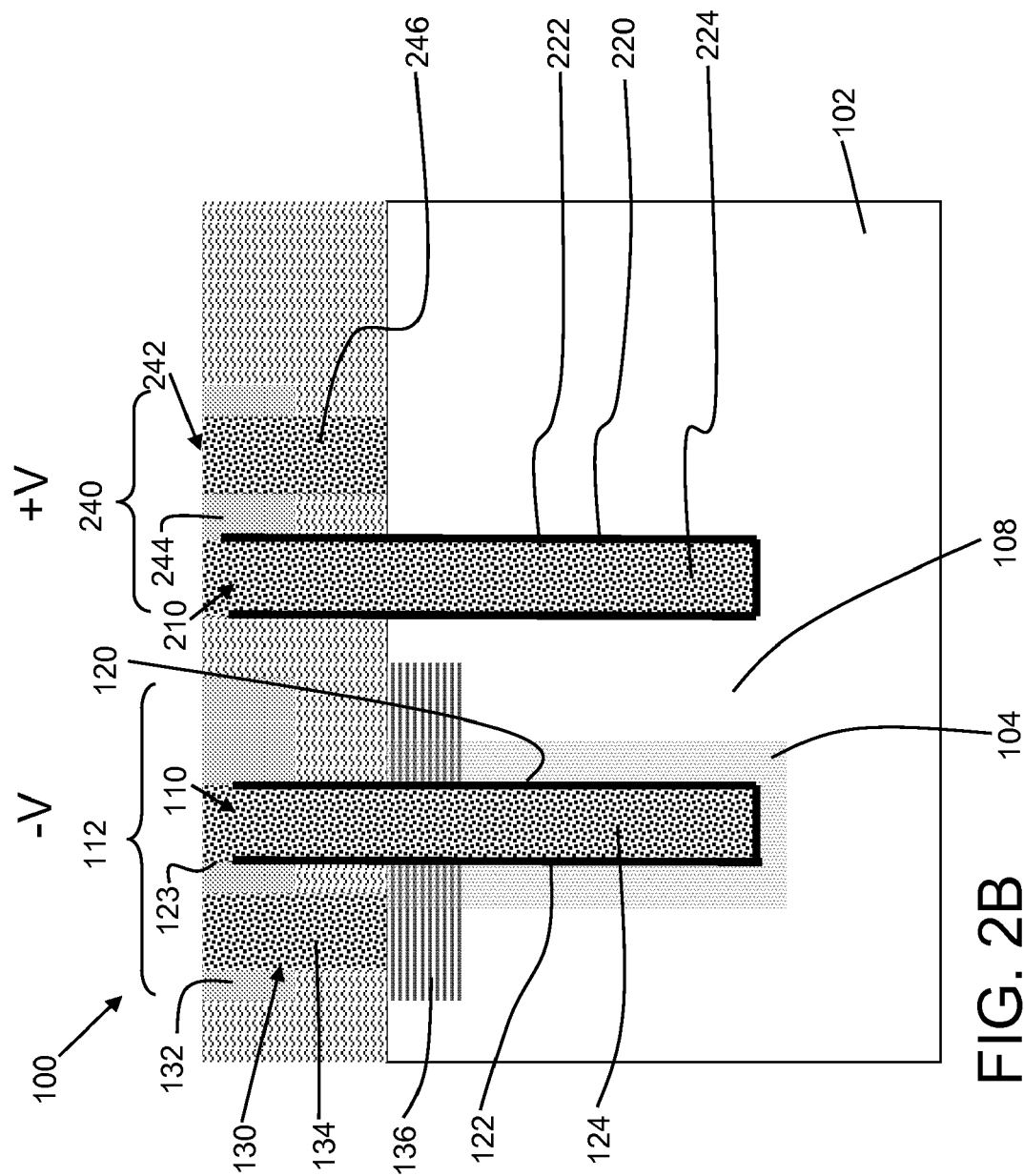

Referring to FIGS. 2A-2B, another embodiment includes a second terminal 240 that takes a different form than second terminal 140, described relative to FIGS. 1, 3A and 3B. In the FIG. 2A embodiment, second terminal 240 includes a varactor 210 including a third region 280 (e.g., an n-band) having the same polarity as first region 104 within substrate 102. Here, second region 108 separates first region 104 and third region 280, and second terminal 240 includes second deep trench 220 located in third region 280. Second node dielectric 222 abuts all but an upper portion 123 of sidewalls and a bottom of second deep trench 220, and second conductive inner electrode 224 is positioned inside second node dielectric 222 and is electrically insulated from third region 280 by the second node dielectric.

A second electrical contact 240 electrically couples second conductive inner electrode 224 to third region 280. Electrical contact 242 may include any now known or later developed manner of coupling inner electrode 224 to third region 280. In the illustrated embodiment, electrical contact 242 may include an interconnect 244 coupling inner electrode 224 to a via 246 that couples to third region 280 Inner electrode 224 directly contacts interconnect 244 within active silicon layer 107 (FIG. 1) where upper portion 123 of second node dielectric 222 is omitted. Interconnect 244 and via 246 may be formed using any conventional techniques, e.g., damascene or dual damascene processing. In one embodiment, as illustrated, a connection region 236 may be positioned at a surface of semiconductor substrate 102 to electrically couple second electrical contact 242 to third region 280. Connection region 236 may include a doped portion of substrate 102, e.g., an n-type doped region. It is emphasized, however, that connection region 236 may not be necessary where third region 280 is sufficiently wide enough for via 246 to electrically couple thereto.

FIG. 2B shows a varactor 210 similar to that of FIG. 2A, but without a third region 280. In this case, second terminal 240 includes varactor 210 including second deep trench 220 located in second region 108 (i.e., having the second p-type polarity). Here, second node dielectric 222 abuts all but an upper portion 123 of sidewalls and a bottom of the second deep trench, and second conductive inner electrode 224 is positioned inside second node dielectric 222 and is electrically insulated from second region 108 by the second node dielectric. Electrical contact 242 electrically couples inner electrode 224 to second region 108 of semiconductor substrate 102.

FIGS. 2A-2B provide an even more improved Q factor compared to FIG. 1 by further addressing the resistance problem of current passing into the, typically, not heavily doped p-type substrate 102, which may prevent it from reaching a bottom of varactor 110. In the FIGS. 2A-2B embodiments, however, trench 220 in p-type substrate 102 (with (FIG. 2A) or without (FIG. 2B) an n-band third region 280) allows third inner electrode 224 to capacitively couple to p-type substrate 102 at a bottom thereof, thus coupling it to p-type substrate terminal 240.

Returning to FIGS. 3A-3B, in another embodiment, aspects of the FIG. 1 embodiment and FIGS. 2A-2B may be combined. In particular, in the FIGS. 3A-3B embodiments, in addition to first terminal 112 and second terminal 140, as described above, a third terminal 240 similar to that described as the second terminal relative to FIGS. 2A-2B is provided. FIG. 3A shows the three terminal embodiment with a third region 280, and FIG. 3B shows the three terminal embodiment without a third region.

The FIG. 3A-3B embodiments operate in a differential mode. In this case, an NP junction is still present via third terminal 240 providing a decoupling arrangement on left side trench 120 (Vac+), but in the case of FIG. 3A a low resistance contact is avoided by making two n-band regions 104, 280 next to each other. This creates a back-to-back NPN differential varactor. In contrast to conventional NPN differential varactors, however, trench 220 and inner electrode 224 overcomes the common resistance problem and maintains a high Q factor.

Figure 4:
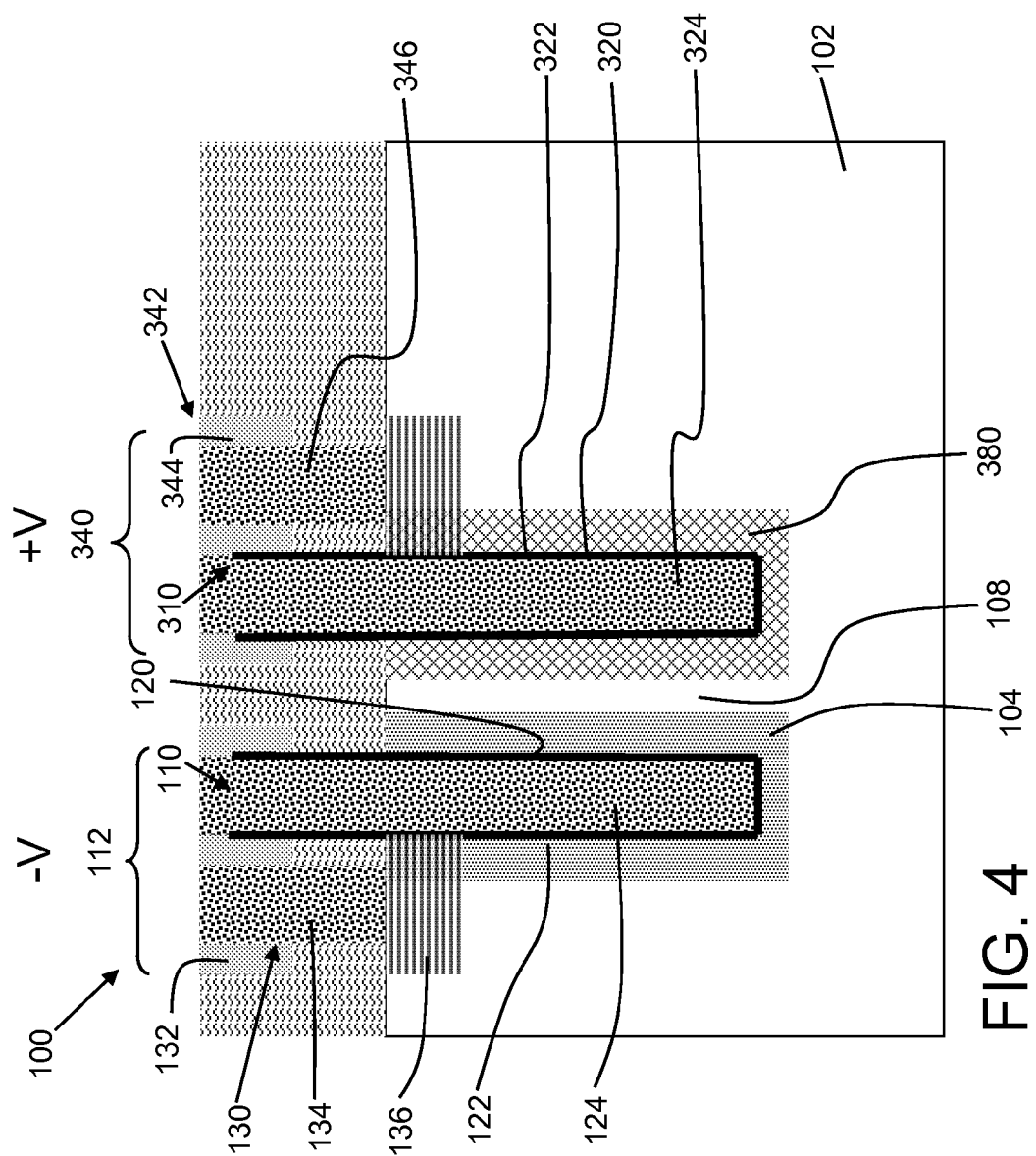
FIG. 4 shows a cross-sectional view of another embodiment of a semiconductor structure.

Referring to FIG. 4, another embodiment of semiconductor structure 100 is illustrated which includes two terminals 112, 340. First terminal 112 is substantially similar to that described above relative to FIGS. 1, 2A-2B and 3A-3B. Second terminal 340 is substantially similar to terminal 240 described above relative to FIGS. 1 and 2A-2B except that a third region 380 thereof has the same polarity as second region 108, but with a different concentration of dopants. That is, first region 104 may include an n-type dopant, second region 108 may include a p-type dopant having a first concentration, and third region 380 may include a p-type dopant having a second concentration different than the first concentration. This embodiment provides a trench-to-trench in junction mode, which is similar to the junction mode FIG. 2B. However, rather than simply omitting an n-band from right hand varactor 210 (FIG. 2B), a p-band (i.e., third region 380) is added to provide lower resistance.

In each of the above-described embodiments, each varactor 110, 210, 310 only includes a single trench 120, 220, 320. However, it is understood that more than one similar trench may be employed for each, with each trench having its inner electrodes coupled to the appropriate region. Similarly, where only one region is illustrated, numerous regions may be merged or partially merged together in each instance. In any event, each of the above-described embodiments provides a trench varactor to provide a high Q path to a trench diffusion, creating an electrically parallel combination of a junction path for DC current and trench to dielectric to the diffusion for AC current.

Figure 5:
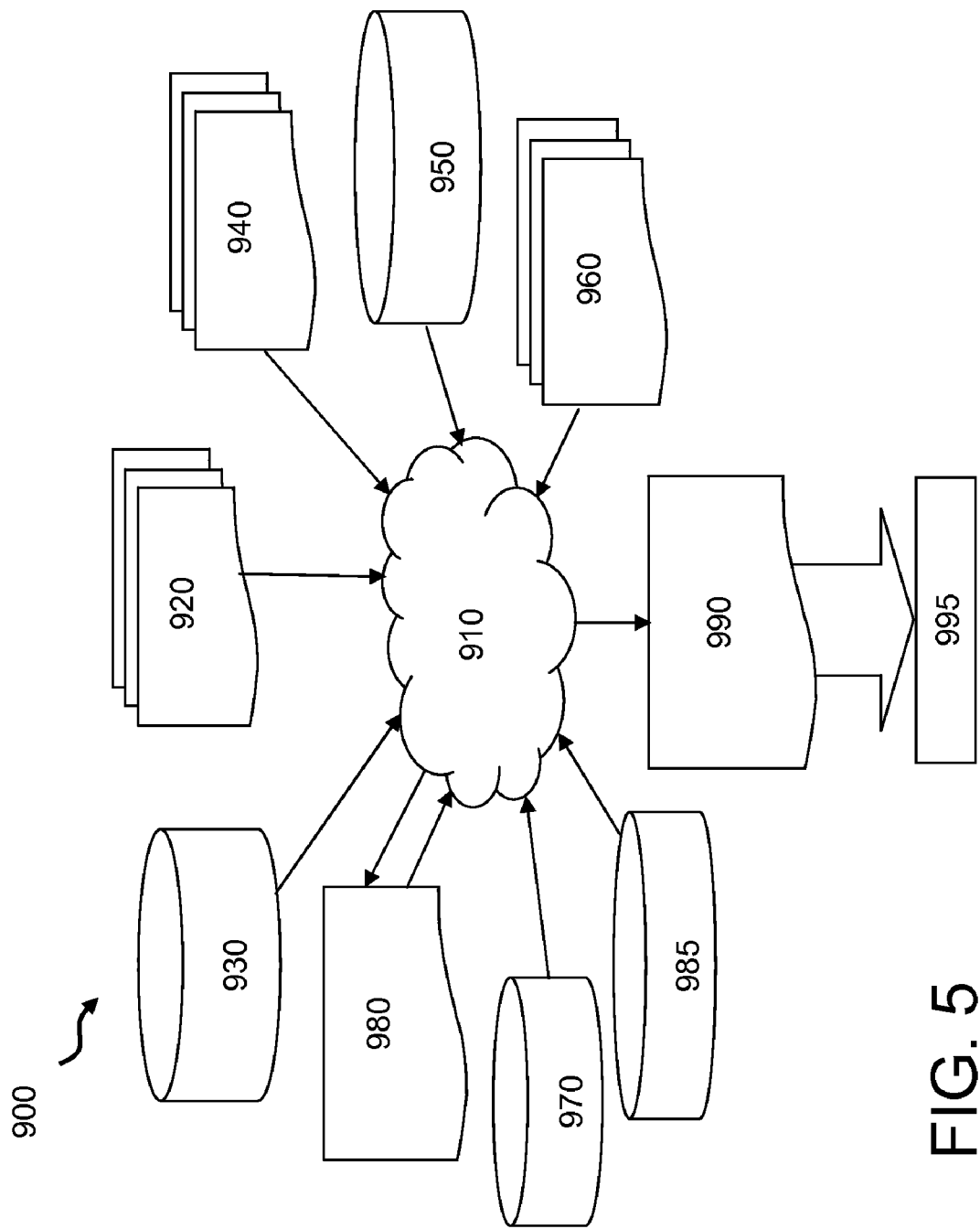
FIG. 5 shows a flow diagram of a design process used in semiconductor design, manufacture, and/or test.

FIG. 5 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 1, 2A-2B, 3A-3B and 4 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIGS. 1, 2A-2B, 3A-3B and 4. Design process 910 preferably synthesizes (or translates) an embodiment of the invention as shown in FIGS. 1, 2A-2B, 3A-3B and 4 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 22 nm, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 1, 2A-2B, 3A-3B and 4, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2A-2B, 3A-3B and 4. Design structure 990 may then proceed to a stage 995 where, for example, design structure 990: proceeds to tape-out, is released to manufacturing, is released to a mask house, is sent to another design house, is sent back to the customer, etc.

Semiconductor structure 100 as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A semiconductor structure comprising:
    a semiconductor substrate having a first region of a first polarity and a second region of a second polarity adjacent to the first region;
    a first terminal including:
        a first deep trench located in the first region,
        a first node dielectric abutting all but an upper portion of sidewalls and a bottom of the first deep trench;
        a first conductive inner electrode inside the first node dielectric and electrically insulated from the first region by the first node dielectric, and
        a first electrical contact electrically coupling the first conductive inner electrode to the first region; and
    a connection region at a surface of the semiconductor substrate electrically coupling the first electrical contact to the first region.

2. The semiconductor structure of claim 1, wherein the first region includes a n-type dopant and the second region includes a p-type dopant.

3. The semiconductor structure of claim 1, further comprising:
    a second terminal including a second electrical contact electrically coupled to the second region of the semiconductor substrate.

4. The semiconductor structure of claim 3, wherein the semiconductor substrate includes a third region having the first polarity, the second region separating the first region and the third region, and further comprising:
    a third terminal including:
        a second deep trench located in the third region,
        a second node dielectric abutting all but an upper portion of sidewalls and a bottom of the second deep trench;
        a second conductive inner electrode inside the second node dielectric and electrically insulated from the third region by the second node dielectric, and
        a third electrical contact electrically coupling the second conductive inner electrode to the third region.

5. The semiconductor structure of claim 4, further comprising a first connection region at a surface of the semiconductor substrate coupling the first electrical contact to the first region, and a second connection region at the surface of the semiconductor substrate electrically coupling the third electrical contact to the third region.

6. The semiconductor structure of claim 3, further comprising:
a third terminal including:
a second deep trench located in the second region,
a second node dielectric abutting all but an upper portion of sidewalls and a bottom of the second deep trench;
a second conductive inner electrode inside the second node dielectric and electrically insulated from the second region by the second node dielectric, and
a third electrical contact electrically coupling the second conductive inner electrode to the second region.

7. The semiconductor structure of claim 1, wherein the first and second polarity are different from one another based on a different dopant concentration or a doping of a different conductivity type.

8. A semiconductor structure comprising:
a semiconductor substrate having a first region of a first polarity and a second region of a second polarity adjacent to the first region and a third region of the first polarity, the second region separating the first region and the third region;
a first terminal including:
a first deep trench located in the first region,
a first node dielectric abutting all but an upper portion of sidewalls and a bottom of the first deep trench;
a first conductive inner electrode inside the first node dielectric and electrically insulated from the first region by the first node dielectric, and
a first electrical contact electrically coupling the first conductive inner electrode to the first region;
a second terminal including:
a second electrical contact electrically coupled to the second region of the semiconductor substrate; and
a third terminal including:
a second deep trench located in the third region,
a second node dielectric abutting all but an upper portion of sidewalls and a bottom of the second deep trench;
a second conductive inner electrode inside the second node dielectric and electrically insulated from the third region by the second node dielectric, and
a third electrical contact electrically coupling the second conductive inner electrode to the third region; and
a first connection region at a surface of the semiconductor substrate coupling the first electrical contact to the first region, and a second connection region at the surface of the semiconductor substrate electrically coupling the third electrical contact to the third region.

9. The semiconductor structure of claim 8, wherein the first and third regions include a n-type dopant and the second region includes a p-type dopant.

10. The semiconductor structure of claim 8, wherein the first and second polarity are different from one another based on a different dopant concentration or a doping of a different conductivity type.

* * * * *